United States Patent [19]

Namiki

[11] Patent Number: 4,700,242

[45] Date of Patent: Oct. 13, 1987

[54] MAGNETIC HEAD SWITCHING CIRCUIT FOR MAGNETIC RECORDING AND REPRODUCING APPARATUS

[75] Inventor: Yasuomi Namiki, Yokohama, Japan

[73] Assignee: Victor Company of Japan, Ltd., Yokohama, Japan

[21] Appl. No.: 803,350

[22] Filed: Dec. 2, 1985

[30] Foreign Application Priority Data

Dec. 13, 1984 [JP] Japan .................................. 59-263619

[51] Int. Cl.[4] .......................... G11B 5/02; G11B 15/12
[52] U.S. Cl. .......................................... 360/68; 360/62
[58] Field of Search .............................. 360/62, 67, 68

[56] References Cited

U.S. PATENT DOCUMENTS

| | | | |
|---|---|---|---|
| 3,959,817 | 5/1976 | Honjo et al. | 360/62 |
| 4,266,254 | 5/1981 | Hobrecht et al. | 360/62 |
| 4,580,177 | 4/1986 | Ito | 360/62 |

OTHER PUBLICATIONS

JVC Service Manual for Model AH-7200U.
JVC Service Manual for Model GK-CIS.

*Primary Examiner*—Vincent P. Canney
*Attorney, Agent, or Firm*—Ladas & Parry

[57] ABSTRACT

A magnetic head switching circuit for a magnetic recording and reproducing apparatus having a recording and reproducing magnetic head has three switching circuits. The first switching circuit is coupled between ground and one end of a winding of the head and controlled between conducting and non-conducting states in response to a voltage applied to a first control terminal. The second switching circuit has an output end, an input end coupled to a D.C. power source, and a second control terminal supplied with a mode switching signal for assuming a non-conducting state in the recording mode and assuming a conducting state in the reproducing mode to guide a voltage at the input end to the output end in response to the mode switching signal. The third switching circuit has an input end coupled to the output end of the second switching circuit and an output end coupled to the first control terminal. When the second switching circuit is in the conducting state, the third switching circuit guides a voltage at the input end of the third switching circuit to the output end of the third switching circuit so as to apply this voltage to the first control terminal and put the first switching circuit into the conducting state.

11 Claims, 9 Drawing Figures

MAGNETIC HEAD SWITCHING CIRCUIT FOR MAGNETIC RECORDING AND REPRODUCING APPARATUS

BACKGROUND OF THE INVENTION

The invention relates, generally, to magnetic head switching circuits for magnetic recording and reproducing apparatuses, and more particularly, to a magnetic head switching circuit for switching a magnetic head so that the magnetic head, which experiences an extremely-high, peak-to-peak, bias voltage, for example at the time of recording, can also be used as a reproducing head at the time of reproduction.

Conventionally, in this kind of a magnetic head switching circuit, therefore, an independent (discrete) or circuit-integrated transistor which can withstand a high voltage must be used to perform the switching satisfactorily. However, when an attempt is made to build the magnetic head switching circuit within an integrated circuit of a signal processing circuit which includes a preamplifier in order to reduce the cost, there is a problem because such an integrated circuit is not designed to withstand the high voltage.

SUMMARY OF THE INVENTION

Accordingly, it is a general object of the present invention to provide a novel and useful magnetic head switching circuit for a magnetic recording and reproducing apparatus, in which the problems described heretofore are eliminated.

Another and more specific object of the present invention is to provide a magnetic head switching circuit for a magnetic recording and reproducing apparatus in which a voltage difference between a D.C. power source and a control input terminal of one switching circuit is divided between two switching circuits, one switching circuit assuming a conducting state in a recording mode and being connected to one end of a winding of a recording and reproducing head which is supplied with a biased voltage. According to the magnetic head switching circuit of the present invention, a switching element which can only withstand a low voltage on the order of 20 V, for example, may be used because the voltage is divided between the two switching circuits other than the one switching circuit. As a result, it is possible to build the magnetic head switching circuit within an integrated circuit of a processing circuit which includes a preamplifier and the like.

Still another object of the present invention is to provide a magnetic head switching circuit for a magnetic recording and reproducing apparatus having three switching circuits. The first switching circuit is coupled between ground and one end of a winding of a recording and reproducing magnetic head and controlled for conducting and non-conducting states in response to a voltage applied to a first control terminal thereof. The second switching circuit has an output end, an input end coupled to a D.C. power source, and a second control terminal supplied with a mode switching signal for assuming a non-conducting state in a recording mode and a conducting state in a reproducing mode to guide a voltage at the input end to the output end in response to the mode switching signal applied to the second control terminal. The third switching circuit has an input end coupled to the output end of the second switching circuit and an output end coupled to the first control terminal of the first switching circuit. When the second switching circuit is in the conducting state, the third switching circuit guides a voltage at the input end thereof to the output end thereof so as to apply this voltage to the first control terminal of the first switching circuit and put the first switching circuit into the conducting state. A voltage difference between the input end and the output end of the second switching circuit is on the order of the voltage from the D.C. power source. Since the D.C. power source voltage is generally less then ⅓ of the bias voltage, it is possible to use, in the second switching circuit, a switching element which can only withstand a low voltage compared to the voltage conventionally required to be withstood. In addition, the voltage difference between the input end and the output end of the third switching circuit is approximately in a range of from earth level to a minimum value of the bias voltage. Accordingly, the voltage difference, which is approximately equal to the difference between the D.C. voltage and the minimum value of the bias voltage, is divided between the first and second switching circuits.

Other objects and further features of the present invention will be apparent from the following detailed description when read in conjunction with the accompanying drawings.

DETAILED DESCRIPTION

Figure 1:
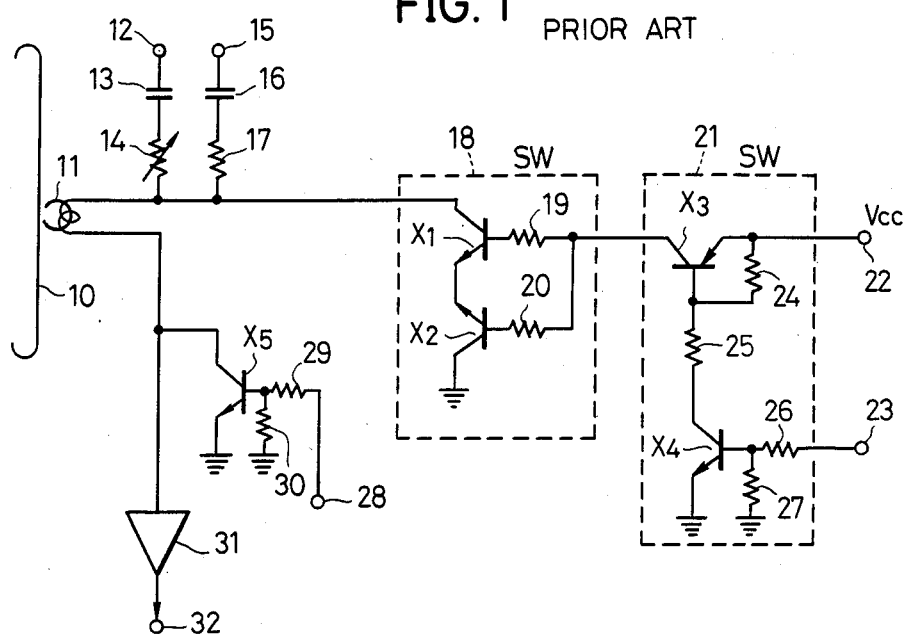
FIG. 1 is a circuit diagram showing an example of a conventional magnetic head switching circuit.

An example of a conventional magnetic head switching circuit is shown in FIG. 1. In a recording mode of a magnetic recording and reproducing apparatus, a bias voltage applied to an input terminal 12 is passed through a capacitor 13 and a variable resistor 14 which are connected in series to one end of a winding of a recording and reproducing magnetic head 11. In addition, a recording signal (for example, an audio signal) applied to an input terminal 15 is passed through a capacitor 16 and a resistor 17 which are connected in series to the one end of the winding of the head 11. This one end of the winding of the head 11 is coupled to a power source terminal 22 and a first mode signal input terminal 23 via switching circuits 18 and 21 which are connected in series. The switching circuit 18 comprises NPN type transistors X1 and X2 having emitters thereof commonly connected to each other, and base resistors 19 and 20. A collector of the transistor X2 is grounded. The switching circuit 21 comprises a PNP type transistors X3 having an emitter thereof connected to the power source terminal 22 and a collector thereof connected to the two base resistors 19 and 20, an NPN type transistor X4 having a base thereof coupled to the input terminal 23 via a voltage dividing circuit which is made up of resistors 26 and 27, a resistor 24 connected between a base and the emitter of the transistor X3, and a resistor 25 connecting the base of the transistor X3 to a collector of the transistor X4. An emitter of the transistor X4 is grounded.

In the recording mode, a first mode signal applied to the input terminal 23 has a low level, and the transistor X4 is turned OFF. Accordingly, the transistors X3 which is applied with a D.C. voltage Vcc from the power source terminal 22 via the resistor 24 to the base thereof is alos turned OFF. Because the transistor X3 is turned OFF, the transistors X1 and X2 are also turned OFF.

Also in the recording mode, a second mode signal applied to a second mode signal input terminal 28 has a high level. This high-level second mode signal is divided in a voltage dividing circuit which is made up of resistors 29 and 30, and is thereafter applied to a base of an NPN type transistor X5 to turn this transistor X5 ON. A collector of the transistor X5 is connected to another end of the winding of the head 11, and an emitter of the transistor X5 is grounded. Hence, in the recording mode, the voltage level at the other end of the winding of the head 11 is approximately equal to the earth level due to the ON state of the transistor X5. As a result, a superimposed signal of the recording signal from the input terminal 15 and the bias voltage from the input terminal 12 is applied to the one end of the winding of the head 11, and the head 11 records a signal on a recording medium 10 such as a magnetic tape.

In the reproducing mode, the first mode signal applied to the input terminal 23 has a high level and the second mode signal applied to the input terminal 28 has a low level. Thus, the transistors X1 through X4 are turned ON and the voltage level at the one end of the winding of the head 11 becomes approximately equal to the earth level. At the same time, the transistor X5 is turned OFF. Therefore, the head 11 reproduce the recorded signal from the recording medium 10, and the reproduced signal obtained from the other end of the winding of the head 11 is passed through a preamplifier 31 and is supplied to an output terminal 32.

Figure 2A:
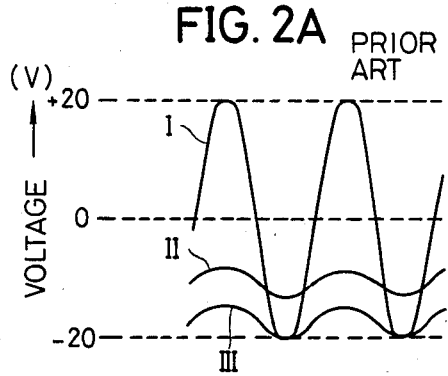
FIGS. 2A and 2B show voltages for explaining the operation of the magnetic head switching circuit shown in FIG. 1.
Figure 2B:
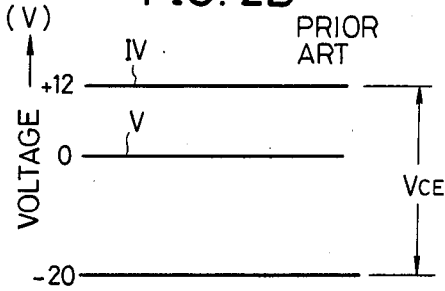

In the recording mode, the transistors X1 and X2 must be in the OFF (non-conducting) states. For this reason, the transistors X1 and X2 must be able to withstand a high voltage even on a case where a large amplitude voltage in the order of 40 $V_{p-p}$ which is indicated by a curve I in FIG. 2A is applied to the collector of the transistor X1. In this case, a voltage indicated by a curve III in FIG. 2A is obtained at the collector of the transistor X3, and a voltage indicated by a curve II in FIG. 2A is obtained at the emitters of the transistors X1 and X2. Further, in the recording mode, the transistors X3 and X4 are turned OFF since a low-level voltage indicated by a straight line V in FIG. 2B is applied to the base of the transistor X4. Thus, the power source voltage Vcc is applied to the emitter and the base of the transistor X3, and a voltage difference $V_{CE}$ indicated by a straight line IV in FIG. 2B is introduced at the maximum between the emitter and the collector of the transistor X3.

Accordingly, in a case where the power source voltage Vcc is equal to 12 V and a minimum value to the collector voltage indicated by the curve III (which is approximately equal to a minimum value of the bias voltage) is $-20$ V, the voltage difference $V_{CE}$ becomes equal to 32 V.

In the conventional magnetic head switching circuit, the transistor X3 must be able to withstand the high voltage, but the switching of the head 11 can be performed satisfactorily when the switching circuits 18 and 21 are constituted by independent parts or when the switching circuits 18 and 21 are constituted by an integrated circuit which is designed exclusively for switching the head 11 and withstanding the high voltage.

However, when an attempt is made to integrate the magnetic head switching circuit within a signal processing circuit which includes the preamplifier 31 in order to reduce the cost, there is a problem because the integrated circuit of the signal processing circuit is not designed to withstand the high voltage.

The present invention has eliminated the problems of the conventional magnetic head switching circuit described heretofore, and description will now be given with respect to embodiments of the magnetic head switching circuit according to the present invention.

Figure 3:
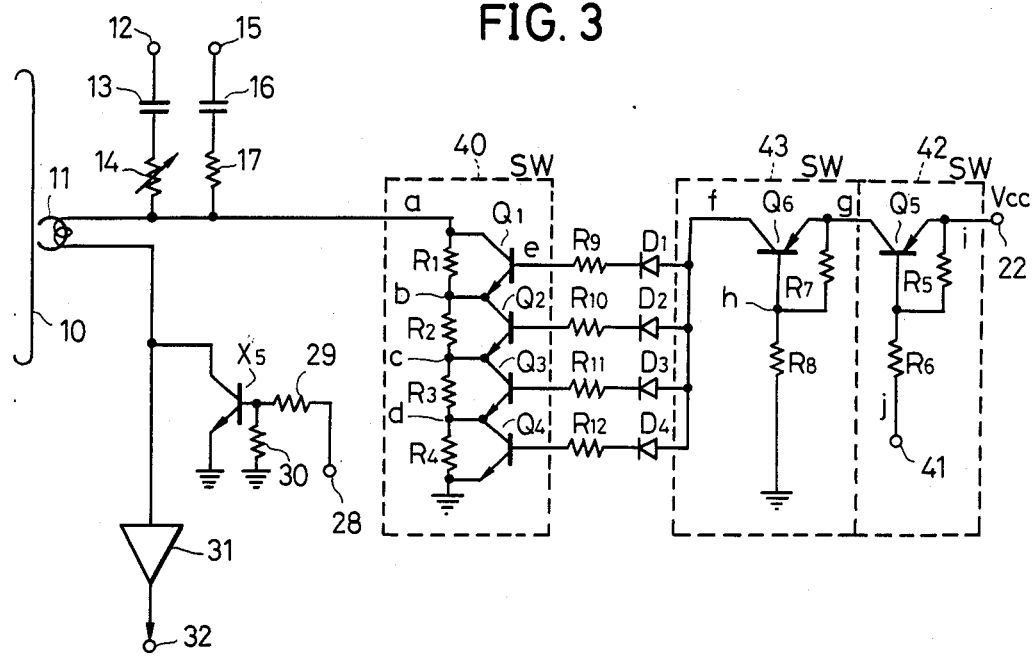
FIG. 3 is a circuit diagram showing an embodiment of the magnetic head switching circuit according to the present invention.

FIG. 3 shows a first embodiment of the magnetic head switching circuit according to the present invention. In FIG. 3, those parts which are the same as those corresponding parts in FIG. 1 are designated by the same reference numerals, and description thereof will be omitted.

Four resistors R1 through R4 are connected in series between ground and the one end of the winding of the head 11 supplied with the bias voltage and the recording signal. Ends of each of the resistors R1 through R4 are respectively connected to a collector and an emitter of a corresonding one of four PNP type transistors Q1 through Q4. The collector of the transistor Q1 is connected to the one end of the winding of the head 11, and the emitter of the transistor Q4 is grounded. The transistors Q1 through Q4 and the resistors R1 through R4 constitute a first switching circuit 40.

A PNP type transistors Q5 has an emitter thereof connected to the input terminal 22 for receiving the D.C. power source voltage Vcc and a base thereof coupled to the input terminal 22 via a resistor R5. A resistor R6 is connected between a mode signal input terminal 41 and a connection point of the resistor R5 and the base of the transistor 5. The transistor Q5 and the resistors R5 and R6 constitute a second switching circuit 42.

A collector of the transistor Q5 is connected to an emitter of a PNP type transistor Q6. In other words, an output end of the second switching circuit 42 is connected to an input end of a third switching circuit 43. The emitter of the transistor Q6 is coupled to a base thereof via a resistor R7. A connection point of the resistor R7 and the base of the transistor Q6 is grounded via a resistor R8. Accordingly, the emitter of the transistor Q6, that is, the input end of the third switching circuit 43, is grounded via the resistors R7 and R8. The transistor Q6 and the resistors R7 and R8 constitute the third switching circuit 43.

An output end of the third switching circuit 43, that is, a collector of the transistor Q6, is coupled to bases of the transistors Q1 through Q4 via four independent circuits. The four independent circuits are a circuit comprising a diode D1 and a resistor R9 which are connected in series, a circuit comprising a diode D2 and a resistor R10 which are connected in series, a circuit comprising a diode D3 and a resistor R11 which are connected in series, and a circuit comprising a diode D4 and a resistor R12 which are connected in series.

In the first embodiment of the magnetic head switching circuit having the construction described heretofore, the transistor Q5 is turned OFF (put into a non-conducting state) in the recording mode responsive to a high-level mode signal applied to the input terminal 41. Accordingly, voltages at the emitter and the base of the transistor Q5 respectively become approximately equal to the D.C. power source voltage Vcc which is 12 V, for example, as indicated by straight lines i and j in FIG. 4B. In addition, because of the OFF state of the transistor Q5, the voltages at the emitter and the base of the transistor Q6 respectively become equal to zero (earth level) as indicated by straight lines g and h in FIG. 4B due to the operation of the resistors R7 and R8. As a result, the transistors Q6 is also turned OFF (put into a non-conducting state). Therefore, a collector-emitter voltage $V_{CE5}$ between the collector and the emitter of the transistor Q5 becomes equal to $+12$ V as shown in FIG. 4B, and it is possible to use for the transistor Q5 a transistor which can withstand only a low voltage in the order of 20 V.

Figure 4A:
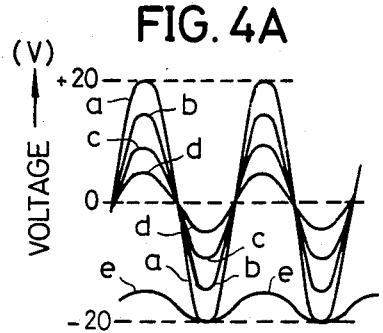
FIGS. 4A and 4B show voltages for explaining the operation of the magnetic head switching circuit shown in FIG. 3.
Figure 4B:
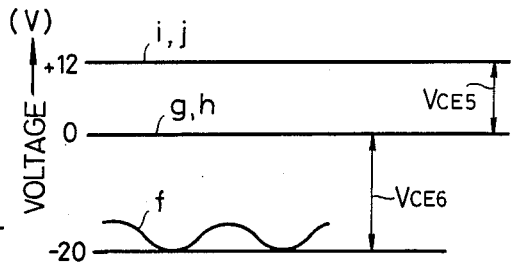

Also, in the recording mode, a bias voltage of 40 $V_{p-p}$ indicated by a curve a in FIG. 4A, for example, is applied to the input terminal 12 and is supplied to the collector of the transistor Q1. This biased voltage a is divided by the resistors R1 through R4, and is applied to the collector of the transistor Q2 as an A.C. voltage in the order of 30 $V_{p-p}$ indicated by a curve b in FIG. 4A. Similarly, an A.C. voltage in the order of 20 $V_{p-p}$ indicated by a curve c in FIG. 4A is applied to the collector of the transistor Q3, and an A.C. voltage in the order of 10 $V_{p-p}$ indicated by a curved d in FIG. 4A is applied to the collector of the transistor Q4. Hence, a negative voltage indicated by a curve e in FIG. 4A is generated at the base of the transistor Q1, and the level of this negative voltage e is shifted in the positive direction by an amount corresponding to a forward voltage drop (for example, in the order of 0.6 V) of the diode D1 and is supplied to the collector of the transistor Q6 as a negative voltage indicated by a curve f in FIG. 4A. Thus, a collector-emitter voltage $V_{CE6}$ between the collector and the emitter of the transistor Q6 becomes in the order of $-19.4$ $V_{p-p}$ as shown in FIG. 4B, and it is possible to use for the transistor Q6 a transistor which can withstand only a low voltage in the order of 20 V.

In FIG. 3, in the reproducing mode, the mode signal applied to the input terminal 41 has a low level and the transistor Q5 is turned ON (put into a conducting state). As a result, the impedance between the collector of the transistor Q5 and the D.C. power source voltage Vcc becomes low. Consequently, the D.C. power source voltage Vcc from the terminal 22 is passed through the emitter and the collector of the transistor Q5 and is supplied to the emitter of the transistor Q6. Further, the D.C. power source voltage Vcc supplied to the emitter of the transistor Q6 is divided by the resistors R7 and R8 and is supplied to the base of the transistor Q6. As a result, the voltage at the base of the transistor Q6 becomes lower than the voltage at the emitter of the transistor Q6 and lower than the threshold voltage, and the transistor Q6 is turned ON (put into a conducting state). Since the high-level voltage from the collector of the transistor Q6 is applied to the bases of the transistors Q1 through Q4, the transistors Q1 through Q4 are also turned ON (put into conducting states). Therefore, the voltage at the one end of the winding of the head 11 is substantially earth level, and the reproduced signal from the other end of the winding of the head 11 is passed through the preamplifier 31 and is supplied to the output terminal 32.

Figure 5:
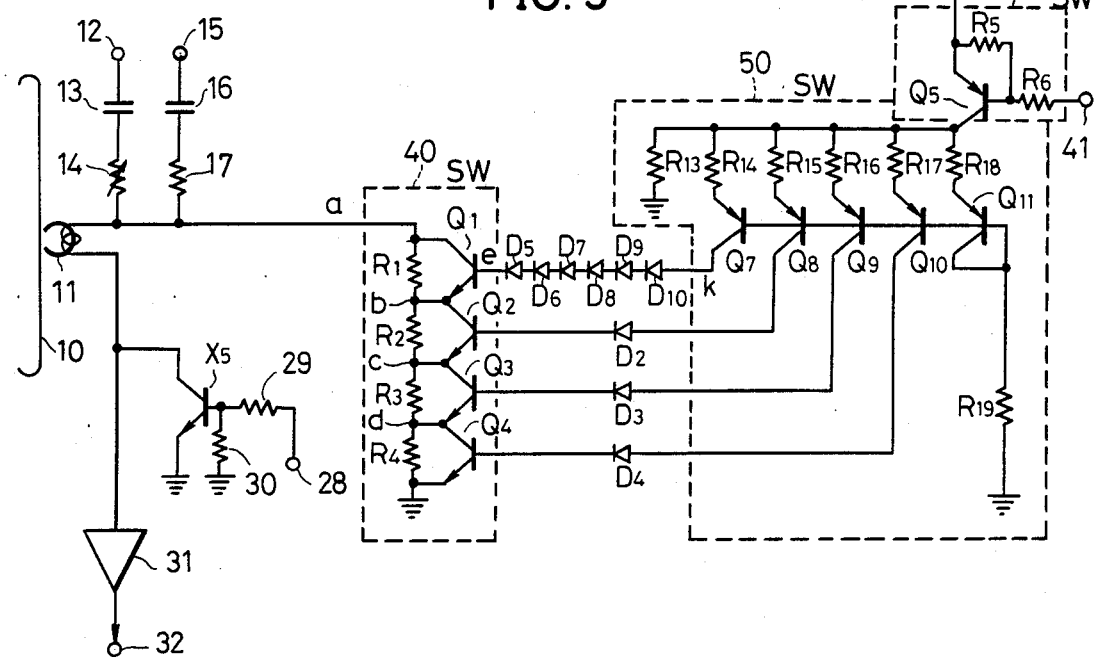
FIG. 5 is a circuit diagram showing another embodiment of the magnetic head switching circuit according to the present invention.

Next, description will be given with respect to a second embodiment of the magnetic head switching circuit according to the present invention by referring to FIG. 5. In FIG. 5, those parts which are the same as those corresponding parts in FIG. 3 are designated by the same reference numerals, and description thereof will be omitted. A third switching circuit 50 comprises five PNP type transistors Q7 through Q11 having bases thereof commonly connected to ground via a resistor R19, resistors R14 through R18 connected between the collector of the transistor Q5 and respective emitters of the transistors Q7 through Q11, and a resistor R13 connected between the collector of the transistor Q5 and ground. A collector of the transistor Q7 is coupled to the base of the transistor Q1 via six diodes D5 through D10 which are connected in series to prevent reverse flow and to shift the level. Collectors of the transistors Q8 through Q10 are coupled to the respective bases of the transistors Q2 through Q4 via the respective diodes D2 through D4 for preventing the reverse flow. The transistor Q11 has a collector thereof connected to the base thereof.

Figure 6A:
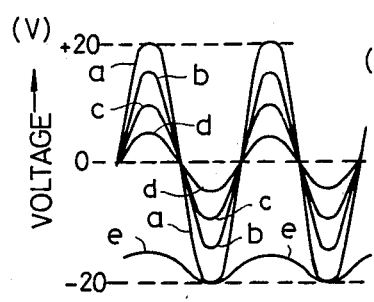
FIGS. 6A and 6B show voltages for explaining the operation of the magnetic head switching circuit shown in FIG. 5.

In the recording mode, the transistor Q5 is turned OFF (put into the non-conducting state). Hence, the voltages at the bases and the emitters of the transistors Q7 through Q11 have earth level, and all of the transistors Q7 through Q11 are turned OFF. Accordingly, the transistors Q1 through Q4 are also turned OFF. In the recording mode, a bias voltage of 40 $V_{p-p}$ indicated by a curve a in FIG. 6A is applied to the collector of the transistor Q1. The level of a negative voltage indicated by a curve e in FIG. 6A which is obtained at the base of the transistor Q1 in the OFF state is shifted in the positive direction by approximately 3.6 V ($=0.6$ V$\times 6$) by the six diodes D5 through D10, and is applied to the collector of the transistor Q7 as a negative voltage indicated by a curve k in FIG. 6B.

Figure 6B:
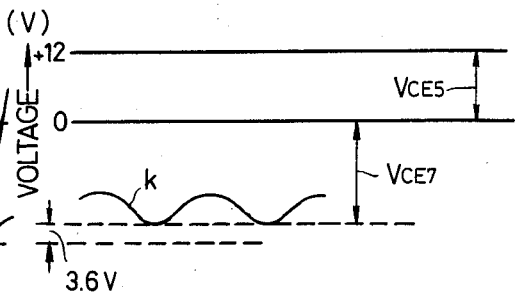

Therefore, a collector-emitter voltage $V_{CE7}$ between the collector and the emitter of the transistor Q7 becomes in the order of $-16.4$ $V_{p-p}$ as shown in FIG. 6B, and it is possible to use for the transistor Q7 a transistor which can withstand only a low voltage in the order of 20 V. In addition, the collector-emitter voltage $V_{CE5}$ of the transistor Q5 becomes as shown in FIG. 6B. Out of the transistors Q7 through Q11, the transistor Q7 is the one which must be noted with regard to the withstand voltage. For this reason, the six diodes D5 through D10 are connected in series in the present embodiment so as to shift the level in the positive direction by a voltage which is six times the forward voltage drop of a single diode. The level of the voltage the transistor Q7 must be able to withstand may be lowered by increasing the number of diodes connected between the collector of the transistor Q7 and the base of the transistor Q1 so as to shift the level and prevent the reverse flow. However, when the number of such diodes is increased excessively, the transistor Q1 will not be turned ON in the reproducing mode due to the output collector current of the transistor Q7. Accordingly, the number of the diodes (level shifting quantity) is selected so that it is possible to obtain a sufficient base current for turning the transistors Q1 through Q4 ON when turning the transistors Q1 through Q4 ON in the reproducing mode.

FIG. 6A is identical to FIG. 4A, and the collector-emitter voltage $V_{CE5}$ shown in FIG. 6B is identical to the collector-emitter voltage $V_{CE5}$ shown in FIG. 4B.

The switching circuit 18 shown in FIG. 1 may be used instead of the first switching circuit 40.

According to the magnetic switching circuit of the present invention, it is possible to build the second switching circuit 42 and the third switching circuit 43 or 50 within an integrated circuit (not shown) in which a fourth switching circuit comprising the preamplifier (reproducing amplifier) 31, the transistor X5, and the resistors 29 and 30 is built-in together with a recording amplifier (not shown), an equalizer (not shown), and a muting circuit (not shown).

Further, the present invention is not limited to these embodiments, but various variations and modifications may be made without departing from the scope of the present invention.

What is claimed is:

1. A magnetic head switching circuit for a magnetic recording and reproducing apparatus which comprises a recording and reproducing magnetic head, said recording and reproducing magnetic head comprising a winding applied with a recording signal and a bias voltage to one end thereof in a recording mode of said magnetic recording and reproducing apparatus, said magnetic head switching circuit being coupled to said one end of the winding of said recording and reproducing magnetic head and being substantially turned OFF in the recording mode and substantially turned ON to ground said one end in a reproducing mode of said magnetic recording and reproducing apparatus, said magnetic head switching circuit comprising: a first switching circuit coupled between ground and said
   one end of the winding of said recording and reproducing magnetic head, said first switching circuit having first control terminal means and being controlled of conducting and non-conducting states thereof responsive to a voltage applied to said first control terminal means, said first switching circuit comprising a plurality of resistors coupled in series between ground and said one end of the winding of said recording and reproducing magnetic head and a plurality of switching transistors provided in correspondence with said plurality of resistors so that two ends of each resistor out of said plurality of resistors are coupled to a collector and an emitter of a corresponding one of said plurality of switching transistors, said first control terminal means of said first switching circuit being bases of said plurality of switching transistors;
   a second switching circuit having an output end, an input end coupled to a D.C. power source, and second control terminal means applied with a mode switching signal, said second switching circuit assuming a non-conducting state in the recording mode and assuming a conducting state in the reproducing mode to guide a voltage at the input end to the output end responsive to the mode switching signal applied to the second control terminal means; and
   a third switching circuit having an input end coupled to the output end of said second switching circuit and an output end coupled to the first control terminal means of said first switching circuit, when said second switching circuit is in the conducting state said third switching circuit guiding a voltage at the input end of said third switching circuit to the output end of said third switching circuit so as to apply this voltage to the first control terminal means of said first switching circuit and put said first switching circuit into the conducting state.

2. A magnetic head switching circuit as claimed in claim 1 which further comprises a predetermined number of level shifting diodes coupled between the output end of said third switching circuit and a base of one of said plurality of switching transistors having a collector coupled to said one end of the winding of said recording and reproducing magnetic head, said predetermined number having said value that a sufficient base current is obtainable to put said one switching transistor in a conducting state when putting said one switching transistor in the conducting state in the reproducing mode.

3. A magnetic head switching circuit as claimed in claim 1 in which said second switching circuit comprises a PNP type transistor having an emitter thereof coupled to said D.C. power source and a base thereof coupled to said second control terminal means.

4. A magnetic head switching circuit as claimed in claim 1 in which said second switching circuit comprises a PNP type transistor having an emitter thereof coupled to said D.C. power source and a base thereof coupled to said second control terminal means, said third switching circuit comprising a plurality of PNP type transistors having emitters thereof coupled to a collector of the transistor of said second switching circuit, said plurality of PNP type transistors having bases thereof common grounded and having collectors thereof coupled to the respective bases of the switching transistors of said first switching circuit.

5. A magnetic head switching circuit as claimed in claim 1 which further comprises a fourth switching circuit coupled between ground and another end of the winding of said recording and reproducing magnetic head and a reproducing preamplifier coupled to said other end of said winding of said recording and reproducing magnetic head, said fourth switching circuit assuming a conducting state in the recording mode and assuming a non-conducting state in the reproducing mode, said second, third, and fourth switching circuits and said preamplifier having a form of an integrated circuit.

6. A magnetic head switching circuit for a magnetic recording and reproducing apparatus which comprises a recording and reproducing magnetic head, said recording and reproducing magnetic head comprising a winding applied with a recording signal and a bias voltage to one end thereof in a recording mode of said magnetic recording and reproducing apparatus, said magnetic head switching circuit being coupled to said one end of the winding of said recording and reproducing magnetic head and being substantially turned OFF in the recording mode and substantially turned ON to ground said one end in a reproducing mode of said magnetic recording and reproducing apparatus, said magnetic head switching circuit comprising: a first switching circuit coupled between ground and said
   one end of the winding of said recording and reproducing magnetic head, said first switching circuit having first control terminal means and being controlled of conducting and non-conducting states thereof responsive to a voltage applied to said first control terminal means;
   a second switching circuit having an output end, an input end coupled to a D.C. power source, and second control terminal means applied with a mode switching signal, said second switching circuit assuming a non-conducting state in the recording mode and assuming a conducting state in the reproducing mode to guide a voltage at the input end to the input end responsive to the mode switching signal applied to the second control terminal means, said second switching circuit comprising a PNP type transistor having an emitter thereof coupled to said D.C. power source and a base thereof coupled to said second control terminal means; and a third switching circuit having an input end coupled to the output end of said second switching circuit and an output end coupled to the first control terminal means of said first switching circuit, said third switching circuit comprising a PNP type transistor having an emitter thereof coupled to a collector of said transistor of said second switching circuit, a base thereof grounded, and a collector thereof coupled to the first control terminal means of said first switching circuit, when said second switching circuit is in the conducting state said third switching circuit guiding a voltage at the input end of said third switching circuit to the output end of said third switching circuit so as to apply this voltage to the first control terminal means of said first switching circuit and put said first switching circuit into the conducting state.

7. A magnetic head switching circuit for a magnetic a recording and reproducing apparatus which comprises a recording and reproducing magnetic head, said recording and reproducing magnetic head comprising a winding applied with a recording signal and a bias voltage to one end thereof in a recording mode of said magnetic recording and reproducing apparatus, said magnetic head switching circuit being coupled to said one end of the winding of said recording and reproducing magnetic head and being substantially turned OFF in the recording mode and substantially turned ON to ground said one end in a reproducing mode of said magnetic recording and reproducing apparatus, said magnetic head switching circuit comprising: a first switching circuit coupled between ground and said one end of the winding of said recording and reproducing magnetic head, said first switching circuit having first control terminal means and being controlled of conducting and non-conducting states thereof responsive to a voltage applied to said first control terminal means;

a second switching circuit having an output end, an input end coupled to a D.C. power source, and a second control terminal means applied with a mode switching signal, said second switching circuit assuming a non-conducting state with respect to the input and output ends thereof in the recording mode and assuming a conducting state with respect to the input and output ends thereof in the reproducing mode to guide a voltage at the input end to the output end responsive to the mode switching signal applied to the second control terminal means; and a third switching circuit comprising first terminal means coupled to the output end of said second switching circuit, second terminal means coupled to the first control terminal means of said first switching circuit, and third terminal means coupled to ground, when said second switching circuit is in the conducting state with respect to the input and output ends thereof, said third switching circuit guiding a voltage at said first terminal means to said second terminal means so as to apply this voltage to the first control terminal means of said first switching circuit and put said first switching circuit into the conducting state, when said second switching circuit is in the non-conducting state with respect to the input and output ends thereof, said third switching circuit having a high impedance between said second and third terminal means.

8. A magnetic head switching circuit as claimed in claim 7 in which said third switching circuit comprises a semiconductor device of a PNP type, said first and second terminal means being positive electrodes of said semiconductor device, and said third terminal means being a negative electrode of said semiconductor device.

9. A magnetic head switching circuit as claimed in claim 7 in which said second switching circuit comprises a PNP type transistor having an emitter thereof coupled to said D.C. power source and a base thereof coupled to said second control terminal means.

10. A magnetic head switching circuit as claimed in claim 9 in which said third switching circuit comprises a PNP type transistor having an emitter thereof coupled to a collector of said transistor of said second switching circuit through said first terminal means, a base thereof coupled to said third terminal means, and a collector thereof coupled to said second terminal means.

11. A magnetic head switching circuit as claimed in claim 7 which further comprises a fourth switching circuit coupled between ground and another end of the winding of said recording and reproducing magnetic head and a reproducing preamplifier coupled to said other end of the winding of said recording and reproducing magnetic head, said fourth switching circuit assuming a conducting state in the recording mode and assuming a non-conducting state in the reproducing mode, said second, third, and fourth switching circuits and said preamplifier having a form of an integrated circuit.

* * * * *